(12) United States Patent
Eisele et al.

(10) Patent No.: US 10,593,608 B2
(45) Date of Patent: Mar. 17, 2020

(54) SEMICONDUCTOR MODULE COMPRISING AN ENCAPSULATING COMPOUND THAT COVERS AT LEAST ONE SEMICONDUCTOR COMPONENT

(71) Applicant: Heraeus Deutschland GmbH & Co. KG, Hanau (DE)

(72) Inventors: Ronald Eisele, Surendorf (DE); Anton-Zoran Miric, Alzenau (DE); Frank Krüger, Nidderau (DE); Wolfgang Schmitt, Rodgau (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 0 days.

(21) Appl. No.: 15/974,930

(22) Filed: May 9, 2018

(65) Prior Publication Data

US 2018/0261518 A1    Sep. 13, 2018

Related U.S. Application Data

(63) Continuation of application No. 15/319,281, filed as application No. PCT/EP2015/060408 on May 12, 2015, now abandoned.

(30) Foreign Application Priority Data

Jun. 18, 2014   (EP) .................................. 14172876

(51) Int. Cl.
*H01L 23/06*       (2006.01)
*H01L 23/29*       (2006.01)
(Continued)

(52) U.S. Cl.
CPC ........ *H01L 23/291* (2013.01); *H01L 23/3135* (2013.01); *H01L 23/3731* (2013.01);
(Continued)

(58) Field of Classification Search
CPC . H01L 23/291; H01L 23/473; H01L 23/3731; H01L 23/467
See application file for complete search history.

(56) References Cited

U.S. PATENT DOCUMENTS 6,164,615 A * 12/2000 Basham ................. B28B 1/008
                                                    248/346.01
6,620,232 B1   9/2003 Kraft et al.
(Continued)

FOREIGN PATENT DOCUMENTS

CN    101933105 A    12/2010
CN    102596654 A    7/2012
(Continued)

OTHER PUBLICATIONS

Int'l. Search Report and Written Opinion dated Jul. 15, 2015 in Int'l Application No. PCT/EP2015/060408.
(Continued)

*Primary Examiner* — Anthony Ho
*Assistant Examiner* — Mohammad M Hoque
(74) *Attorney, Agent, or Firm* — Panitch Schwarze Belisario & Nadel LLP

(57) ABSTRACT

A semiconductor module (10) contains a ceramic interconnect device (50) having at least one semiconductor component (20). The at least one semiconductor component (20) is covered by an encapsulating compound (30) which contains a cured inorganic cement and has a thermal expansion coefficient in the range of 2 to 10 ppm/K. The ceramic of the ceramic interconnect device (50) is selected from ceramics based on aluminum oxide, aluminum nitride or silicon nitride.

11 Claims, 3 Drawing Sheets

(51) Int. Cl.
*H01L 23/473* (2006.01)
*H01L 23/31* (2006.01)
*H01L 23/373* (2006.01)
*H01L 23/467* (2006.01)
*H01L 23/00* (2006.01)
*H01L 23/367* (2006.01)

(52) U.S. Cl.
CPC ........ *H01L 23/3735* (2013.01); *H01L 23/467* (2013.01); *H01L 23/473* (2013.01); *H01L 23/367* (2013.01); *H01L 24/40* (2013.01); *H01L 24/48* (2013.01); *H01L 2224/32225* (2013.01); *H01L 2224/40225* (2013.01); *H01L 2224/48091* (2013.01); *H01L 2224/48227* (2013.01); *H01L 2224/48472* (2013.01); *H01L 2224/73263* (2013.01); *H01L 2224/73265* (2013.01); *H01L 2924/00014* (2013.01); *H01L 2924/181* (2013.01); *H01L 2924/19107* (2013.01)

(56) References Cited

U.S. PATENT DOCUMENTS

| | | | |
|---|---|---|---|
| 8,358,514 | B2 | 1/2013 | Kashiwazaki et al. |
| 8,637,980 | B1 | 1/2014 | Lower et al. |
| 2009/0047797 | A1 | 2/2009 | Anderson et al. |
| 2009/0068474 | A1 | 3/2009 | Lower et al. |
| 2010/0090335 | A1 | 4/2010 | Chung |
| 2010/0097775 | A1 | 4/2010 | Kashiwazaki et al. |
| 2010/0328007 | A1 | 12/2010 | Witzani et al. |
| 2011/0124483 | A1 | 5/2011 | Shah et al. |
| 2013/0229777 | A1 | 9/2013 | Otremba et al. |
| 2014/0001613 | A1* | 1/2014 | Ha ................... H01L 23/24 257/675 |
| 2014/0096704 | A1* | 4/2014 | Rademan ............ C04B 14/304 106/666 |

FOREIGN PATENT DOCUMENTS

| | | | |
|---|---|---|---|
| CN | 103295976 | A | 9/2013 |
| DE | 1514413 | A1 | 6/1969 |
| DE | 102008007021 | A1 | 8/2009 |
| DE | 102013102058 | A1 | 9/2013 |
| GB | 1095387 | A | 12/1967 |
| JP | S58225121 | A | 12/1983 |
| JP | S60226149 | A | 11/1985 |
| JP | S61-036318 | A | 2/1986 |
| JP | H2-229858 | A | 9/1990 |
| JP | H3155655 | A | 7/1991 |
| JP | H10-251343 | A | 9/1998 |
| JP | 2000340718 | A | 12/2000 |
| JP | 2007158280 | A | 6/2007 |
| JP | 2009067890 | A | 4/2009 |
| JP | 2009252838 | A | 10/2009 |
| JP | 2011142366 | A | 7/2011 |
| JP | 2013225556 | A | 10/2013 |
| JP | 2013229392 | A | 11/2013 |
| KR | 20100109976 | A | 10/2010 |

OTHER PUBLICATIONS

Office Action dated Jan. 9, 2018 in JP Application No. 2016-567775.
Office Action dated Dec. 8, 2017 in KR Application No. 1020177001116.
Office Action dated Dec. 28, 2017 in JP Application No. 2016-567775 (English translation only).
Office Action dated Apr. 27, 2018 in CN Application No. 201580032384.8.
Office Action dated Sep. 26, 2017 in U.S. Appl. No. 15/319,281, by Eisele.
Office Action dated Mar. 13, 2018 in U.S. Appl. No. 15/319,281, by Eisele.
Office Action dated Aug. 21, 2018 in JP Application No. 20116-567775.
Office Action dated Dec. 26, 2018 in CN Application No. 201580032384.8 (German translation).

* cited by examiner

SEMICONDUCTOR MODULE COMPRISING AN ENCAPSULATING COMPOUND THAT COVERS AT LEAST ONE SEMICONDUCTOR COMPONENT

CROSS-REFERENCE TO RELATED APPLICATIONS

This application is a Continuation of co-pending U.S. patent application Ser. No. 15/319,281, filed Dec. 15, 2016, which was a Section 371 of International Application No. PCT/EP2015/060408, filed May 12, 2015, which was published in the German language on Dec. 23, 2015 under International Publication No. WO 2015/193035 A1, and which claims priority under 35 U.S.C. § 119(b) to European Application No. 14172876.6, filed Jun. 18, 2014, and the disclosures of which are incorporated herein by reference.

BACKGROUND OF THE INVENTION

The invention relates to a semiconductor module comprising an encapsulating compound that covers at least one semiconductor component.

Preferably, the encapsulation of individual semiconductors and semiconductor sub-assemblies (including passive components) on substrates (ceramic, metal and organic core printed circuit boards) is effected nowadays by means of organic masses based, for example, on epoxy resin, with, in some cases, inorganic filling materials, such as silicon dioxide ($SiO_2$). U.S. Pat. No. 4,529,755, for example, discloses an encapsulating compound of this type comprising a poly-functional epoxy compound, a styrene-type block copolymer, a curing agent for the epoxy compound, and an inorganic filling agent.

Said encapsulated components and sub-assemblies typically have electrical connectors and cooling connection surfaces for the integrated power components.

For applications of power electronics, the focus is on components and sub-assemblies with high power dissipation and, to some extent, high operating voltages as well, i.e. insulation requirements. In components and sub-assemblies of power electronics, ceramic substrates with cores made of aluminum oxide, aluminum nitride or silicon nitride are predominantly used as interconnect devices.

U.S. Pat. No. 7,034,660 B2 discloses a wireless sensor that is embedded in concrete or any other cement-containing material in order to detect parameters that are indicative of changes in construction materials. The sensor can, for example, be an electrochemical sensor that is well-suited for detecting chloride ions.

BRIEF SUMMARY OF THE INVENTION

It is the object of the invention to provide a semiconductor module, in particular a power electronics sub-assembly, with improved encapsulation.

The object is solved by a semiconductor module (10) comprising a ceramic interconnect device (50) bearing at least one semiconductor device (20); the ceramic is selected from the group consisting of ceramics based on aluminum oxide, aluminum nitride or silicon nitride. The at least one semiconductor device (20) is covered by an encapsulating compound (30), characterized in that the encapsulating compound (30) comprises a cured inorganic cement and has a thermal expansion coefficient in the range of 2 to 10 ppm/K.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
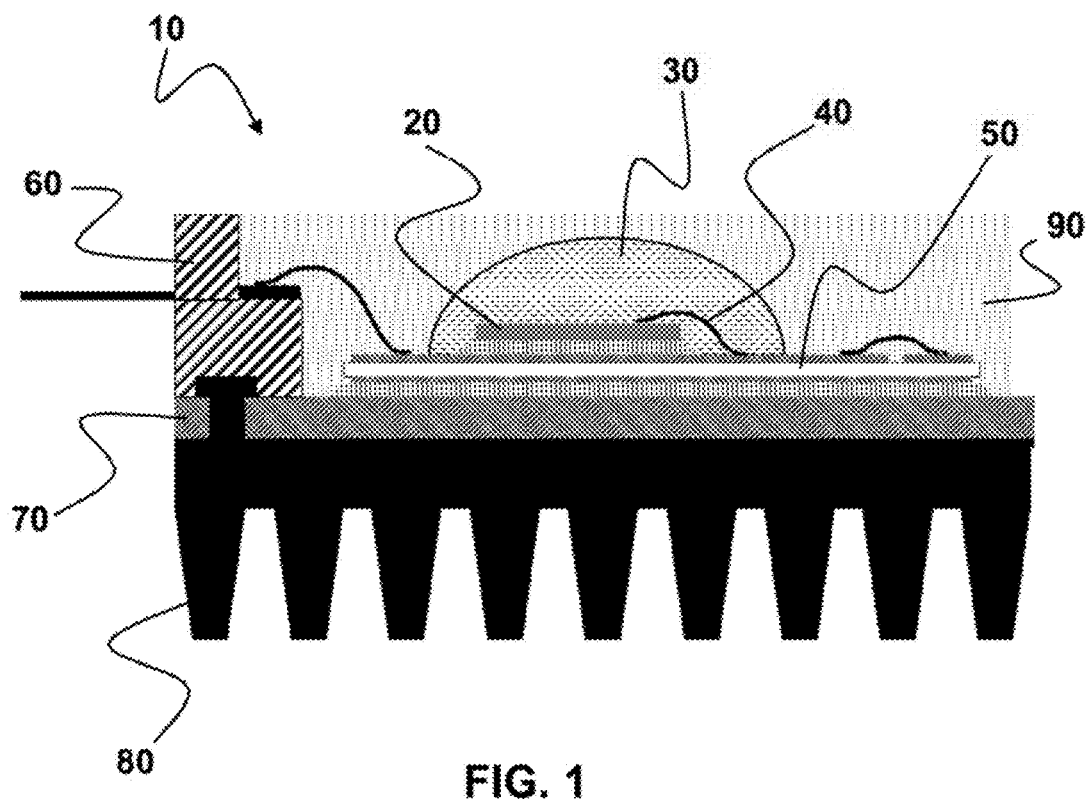
FIG. 1 shows the schematic design of a semiconductor module (10) according to the invention according to a first exemplary embodiment, in which the encapsulating compound (30) is provided as glob-top.

Aside from its special encapsulating compound (30), the semiconductor module (10) is a common semiconductor module that comprises a ceramic interconnect device (ceramic substrate) (50) bearing one or more semiconductor component(s) (20). Specifically, the semiconductor device or devices (20) is/are a semiconductor that develops significant heat during its intended use due to power dissipation, i.e., which reaches self-destroying temperatures of, for example, 150 to >200° C. in the absence of encasing and encapsulation, as are used in power electronic sub-assemblies, in particular the semiconductor component or components (20) are not sensors or measuring probes. The ceramic of the interconnect device (50) is a ceramic selected from the group of ceramics based on aluminum oxide, aluminum nitride or silicon nitride. In other words, it is a ceramic with a 95 to 100% by weight fraction of aluminum oxide, aluminum nitride or silicon nitride.

The encapsulating compound (30) is an essentially or fully inorganic metal-free material. It has a thermal expansion coefficient in the range of 2 to 10 ppm/K. The encapsulating compound (30) comprises a cured inorganic cement.

In other words, the encapsulating compound (30) consists of a cured inorganic cement or it comprises one or more ingredients aside from the cured inorganic cement that forms a matrix. The ingredients are preferred to be electrically non-conductive.

The cured inorganic cement forming the matrix of the encapsulating compound (30) or the encapsulating compound (30) as such has a thermal expansion coefficient in the range of 2 to 10 ppm/K. The cured inorganic cement can be formed by mixing a powdered mixture of inorganic binding agent and inorganic additives with water to form a pourable mass, pouring the pourable mass thus formed, followed by setting and drying the poured mass.

In one embodiment, the powdered mixture of inorganic binding agent and inorganic additives can be a phosphate cement that is known to a person skilled in the art, for example, preferably, magnesium phosphate cement, in particular magnesium oxide- and zirconium silicate-containing magnesium phosphate cement. The product marketed by the name of ZIRCON POTTING CEMENT NO. 13 by Sauereisen is one example of such materials.

The above-mentioned potting of the pourable mass formed by mixing a suitable powdered mixture of inorganic binding agent and inorganic additives with water can take place by methods known to a person skilled in the art, for example by gravity- or pressure-driven potting. It can be expedient in this context to surround the component and/or sub-assembly to be encased with half-shell molds and to then fill these with the pourable mass. After setting and drying, the encapsulated component and/or encapsulated sub-assembly can be taken out after the half shells are opened.

The potting can take place, for example, such that the encapsulating compound (30) is formed as "glob-top" known to a person skilled in the art.

However, it can also be performed such that the encapsulating compound (30) partially or fully encapsulates electrical contacting elements (40) that are connected to the semiconductor component (20), such as, for example, bond wires, ribbons and/or leadframes. Partial encapsulation shall be understood to mean that one or more of the contacting elements (40) are incompletely encapsulated and/or one or more of the contacting elements (40) are not encapsulated, whereas full encapsulation shall be understood to mean that all contacting elements (40) are fully encapsulated.

The setting and drying take place for, for example, 30 to 120 minutes in a temperature range of 20 to 120° C. The inorganic cement is cured during the setting and drying.

As mentioned above, the encapsulating compound (30) can consist of the cured inorganic cement or can comprise one or more ingredients aside from the cured inorganic cement that serves as a matrix. In the latter case, the further ingredient or ingredients of the pourable mass shall be added before the potting, i.e., shall be admixed before and/or after the addition of water. The further ingredient or ingredients can just as well be admixed to the powdered mixture of inorganic binding agent and inorganic additives before mixing them with water to form a pourable mass, or the admixture can take place after the addition of water. However, it is feasible just as well to admix a fraction of the ingredients before and the remaining fraction after the addition of water.

Examples of ingredients the encapsulating compound (30) can comprise aside from the cured inorganic cement include aluminum nitride particles, boron nitride particles, aluminum oxide particles and/or silicon nitride particles at a total volume fraction of, for example, 25 to 90% by volume, relative to the volume of the encapsulating compound (30). The presence of these particles in the encapsulating compound (30) has a beneficial effect on its thermal conductivity. Examples of suitable aluminum nitride particles include those with a mean particle size (d50), as determined by laser diffraction, in the range of 0.8 to 11 μm, which are distributed commercially, for example, by H.C. Starck.

Further examples of possible ingredients the encapsulating compound (30) can comprise aside from the cured inorganic cement include fibers, i.e., the encapsulating compound (30) can comprise one or more different types of fibers. For example, the fraction of fibers can be in the range of up to 20% by volume, preferably can be in the range of 10 to 20% by volume. Examples of fibers that can be used include inorganic fibers, such as glass fibers, basalt fibers, boron fibers, and ceramic fibers, for example silicon carbide fibers and aluminum oxide fibers, as well as high-melting organic fibers, such as, for example, aramid fibers. The presence of these fibers in the encapsulating compound (30) has a beneficial effect on its tensile strength and thermal fatigue resistance.

In one embodiment, all surfaces contacting the encapsulating compound (30) are not coated, but rather provided with an adhesive coating layer (primer layer), for example with a coating layer applied, for example by spray application, from a polyacrylate dispersion.

The encapsulating compound (30) can comprise some residual porosity, which is the reason for a moisture-resistant coat to be provided in one embodiment. For example, the capillaries can be filled by low viscosity protective masses, which permanently seal the capillaries. Specifically, aqueous solutions of potassium or lithium silicates are well-suited for this purpose. It is feasible just as well to coat the outer surface of the encapsulating compound (30) with a protective layer that is not or hardly penetrated by moisture. For example, coating agents based on curable epoxy resins can be used for this purpose The capability of the encapsulating compound (30) to bond physically enables preferred heat conduction from the semiconductor, which is subject to power dissipation, via the encapsulating compound (30) to a cooling element (80). This can be either one-sided or—originating from the semiconductor (20)—multi-sided. Accordingly, the encapsulating compound (30) preferably represents a heat bridge that establishes the thermal path to one or more, in particular metallic, cooling elements (80), made, for example, from aluminum or copper.

The dissipation of heat proceeds through the encapsulating compound (30) to the outer surface of the encapsulated sub-assembly to, for example, the cooling elements (80) and/or by heat emission. It can be beneficial for the dissipation of heat if the physical connection between the encapsulating compound (30) and the cooling element or elements (80), the semiconductor (20) and the ceramic interconnect device (50) comprises a chemical bond. Accordingly, heat can be dissipated on multiple sides by combining substrate-based cooling and cooling based on encapsulating compound (30).

FIG. 1 shows a semiconductor module (10), preferably designed as a sub-assembly for power electronics, with a semiconductor component (20) that is covered by an encapsulating compound (30). Preferably, the bond wires contacting the semiconductor device (20) are also covered and/or encapsulated by the encapsulating compound (30), at least in part, but particularly preferably completely.

In this context, the semiconductor component (20)—as is known—is attached on a ceramic interconnect device (50) which, in turn, is applied to the upper side of a heat dissipation plate (70) whose underside is connected to a cooling element (80). Moreover, the semiconductor module (10) comprises a frame (60) as support of electrical contacts that are routed towards the outside.

In said first exemplary embodiment, the coaching mass (30) is provided simply as a droplet ("glob-top") that covers/ encapsulates the semiconductor component (20) and its bond wires (40). In this context, the "glob-top" and the other surface regions of the semiconductor module (10) are covered by an insulating mass (90), for example a silicone gel.

Figure 2:
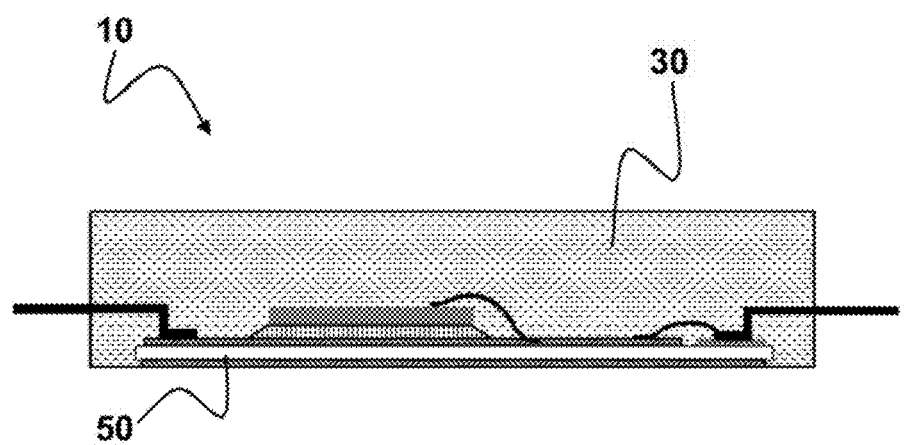
FIG. 2 shows the schematic design of a semiconductor module (10) according to a second exemplary embodiment, which, except for the mechanical-electrical contact leads, is fully encapsulated by the encapsulating compound (30)

FIG. 2 shows a semiconductor module (10) designed according to a second exemplary embodiment to have a frame-less design, which, except for the electrical and thermal contact surfaces, is fully encapsulated by the encapsulating compound (30).

This refinement is well-suited, in particular, as starting point for the exemplary embodiments shown in the following figures.

Figure 3:
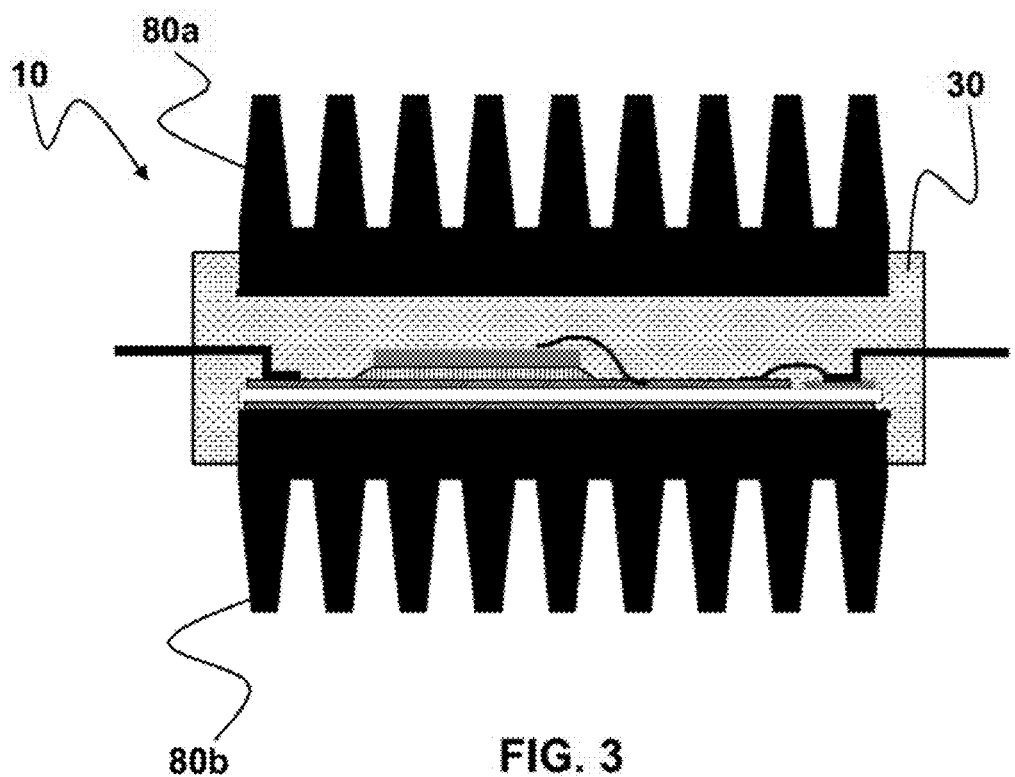
FIG. 3 shows the schematic design of a semiconductor module (10) according to a third exemplary embodiment with cooling elements (80a, 80b) for air cooling being arranged on both sides of the semiconductor (20)

FIG. 3 shows a power sub-assembly with air cooling provided on two sides, whereby the upper cooling element (80a) is physically connected to a heat bridge consisting of the encapsulating compound (30) physically contacting the cooling element (80a), and the lower cooling element (80b) is physically connected to the ceramic interconnect device (50).

The cooler structure shown is a single part in each case and is connected to cooling ribs or cooling pins such that air can pass through as turbulent as possible.

Figure 4:
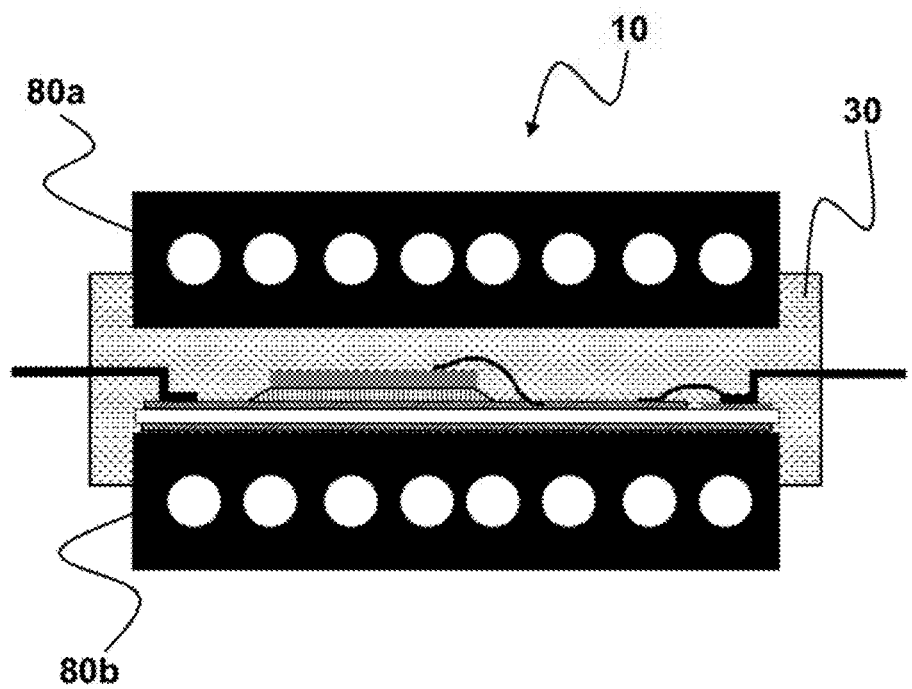
FIG. 4 shows the schematic design of a semiconductor module (10) according to a fourth exemplary embodiment with cooling elements (80a, 80b) for water cooling being arranged on both sides of the semiconductor (20)

FIG. 4 shows a power sub-assembly with two-sided water cooling according to the refinement shown in FIG. 3, whereby the cooler structure shown in FIG. 4 is provided as a single part and is provided with internal water-conducting channels such that water can pass through in a closed structure with short sealing length.

Figure 5:
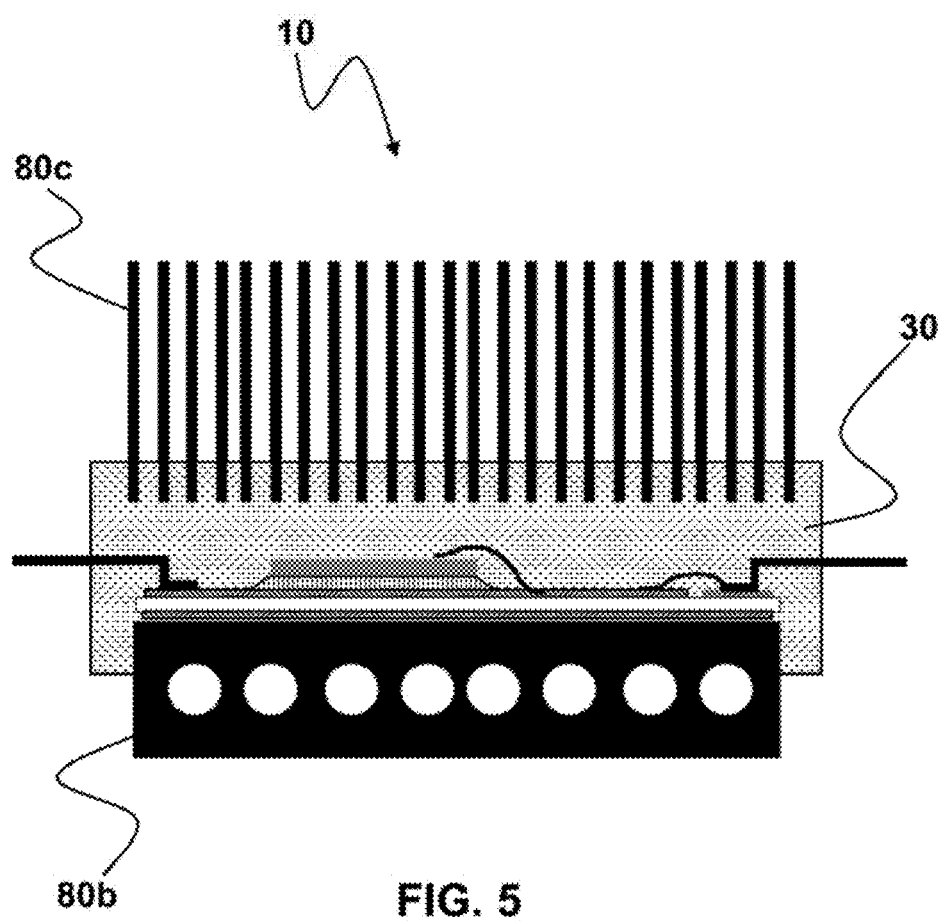
FIG. 5 shows the schematic design of a semiconductor module (10) according to a fifth exemplary embodiment with a cooling element for air cooling (80c) being arranged on one side of the semiconductor (20) and a cooling element for water cooling (80b) being arranged on the other side of the semiconductor (20).

And lastly, FIG. 5 shows a power sub-assembly with two-sided cooling, whereby the lower cooling element (80b) is again provided as a single part, whereas the upper cooling element (80c) is provided as multiple parts. The cooler structure shown as upper cooling element (80c) consists, for example, of a plurality of cooling plates extending over the upper side of the semiconductor module (10) or consists of a plurality of cooling pins distributed over the surface of the semiconductor module (10).

The semiconductor module (10) according to the invention comprises an encapsulating compound (30) that has been improved in several respects. These include, in particular, a thermal expansion coefficient in harmony with a ceramic interconnect device which has a beneficial impact in terms of preventing undesired phenomena such as delamination (for example due to thermal shear voltages) and destruction of the encapsulated contacting elements (for example shearing of bond wires). Another advantage of the encapsulating compound (30) is its comparatively good thermal conductivity providing a basis for good heat dissipation from the semiconductor module (10) and/or the at least one semiconductor component (20) during the intended operation. The adhesion to the surfaces contacting the encapsulating compound (30) is also good. Ultimately, the benefits mentioned above also mean that the semiconductor module (10) is improved in terms of its durability and in that it can be operated at comparatively high electrical power.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for producing a semiconductor module comprising a ceramic interconnect device having at least one semiconductor component, wherein the at least one semiconductor component is covered by an encapsulating compound comprising a cured inorganic cement and having a thermal expansion coefficient in the range of 2 to 10 ppm/K, the method comprising:
   providing the ceramic interconnect device having the at least one semiconductor component,
   forming the cured inorganic cement by mixing a powdered mixture of an inorganic binding agent and inorganic additives with water to form a pourable mass, pouring the pourable mass, and setting and drying the poured mass for 30 to 120 minutes in a temperature range of 20° C. to 120° C., wherein the powdered mixture of the inorganic binding agent and the inorganic additives is a magnesium phosphate cement, and
   covering the at least one semiconductor component with the encapsulating compound comprising the cured inorganic cement and having the thermal expansion coefficient in the range of 2 to 10 ppm/K,
   wherein the ceramic of the ceramic interconnect device is selected from the group consisting of ceramics based on aluminum oxide, aluminum nitride, and silicon nitride.

2. The method according to claim 1, wherein the encapsulating compound is provided as a "glob-top".

3. The method according to claim 1, wherein the semiconductor module further comprises contacting elements connected to the at least one semiconductor component, and wherein the encapsulating compound partially or fully encapsulates the contacting elements.

4. The method according to claim 1, wherein the encapsulating compound comprises aluminum nitride particles, boron nitride particles, aluminum oxide particles and/or silicon nitride particles at a total volume fraction of 25 to 90% by volume, relative to the volume of the encapsulating compound.

5. The method according to claim 1, wherein the encapsulating compound comprises one or more different types of fibers.

6. The method according to claim 1, wherein the semiconductor module further comprises at least one cooling element that is physically connected to the encapsulating compound.

7. The method according to claim 6, wherein the at least one cooling element is an air-cooled or a liquid-cooled cooling element.

8. The method according to claim 1, wherein the magnesium phosphate cement is a magnesium oxide- and zirconium silicate-containing magnesium phosphate cement.

9. The method according to claim 1, wherein the semiconductor module is a power electronics sub-assembly.

10. The method according to claim 9, wherein the at least one semiconductor component is attached to the ceramic interconnect device applied to an upper side of a heat dissipation plate having an underside which is connected to a cooling element,
   wherein the encapsulating compound is provided as a glob-top,
   wherein the semiconductor module further comprises a frame to support electrical contacts that are routed toward the outside and bond wires connecting the at least one semiconductor component,
   wherein the bond wires are at least partly covered by the encapsulating compound, and
   wherein the glob-top and other surface regions of the semiconductor module are covered by an insulating mass.

11. The method according to claim 10, wherein the insulating mass is a silicone gel.

\* \* \* \* \*